United States Patent [19]

Uehira

[11] Patent Number: 4,755,883

[45] Date of Patent: Jul. 5, 1988

[54] REMOVABLE INFORMATION INPUTTING DEVICE FOR AN ELECTRONIC RECORDING APPARATUS

[75] Inventor: Shigeyuki Uehira, Nara, Japan

[73] Assignee: Sharp Kabushiki Kaisha, Osaka, Japan

[21] Appl. No.: 774,889

[22] Filed: Sep. 11, 1985

[30] Foreign Application Priority Data

Sep. 12, 1984 [JP] Japan .................................. 59-192378

[51] Int. Cl.⁴ ............................................. H04N 5/76
[52] U.S. Cl. .................................. 358/335; 358/194.1; 360/55; 360/137; 369/20; 455/600; 455/603; 455/613
[58] Field of Search ................... 358/181, 335, 191.1, 358/194.1; 360/55, 69; 369/19, 20; 235/379, 380; 455/603, 613, 600, 175, 181; 364/401

[56] References Cited

U.S. PATENT DOCUMENTS

| 4,488,179 | 12/1984 | Kruger et al. | ............... 358/181 |
| 4,625,080 | 11/1986 | Scott | ............... 358/335 X |
| 4,625,276 | 11/1986 | Benton | ............... 235/380 X |
| 4,644,349 | 2/1987 | Fujita et al. | ............... 358/194.1 X |

Primary Examiner—Robert L. Richardson
Attorney, Agent, or Firm—Birch, Stewart, Kolasch & Birch

[57] ABSTRACT

A removable information inputting device which is removably provided with an electronic apparatus includes a keyboard for inputting an information of a program to be recorded, a memory for storing the information from the keyboard, a control circuit for controlling the input and the output of the information stored in the memory, and an optical transmission circuit for optically transmitting the information from the memory to the electronic apparatus.

4 Claims, 5 Drawing Sheets

FIG. 2(A)
FIG. 2(B)
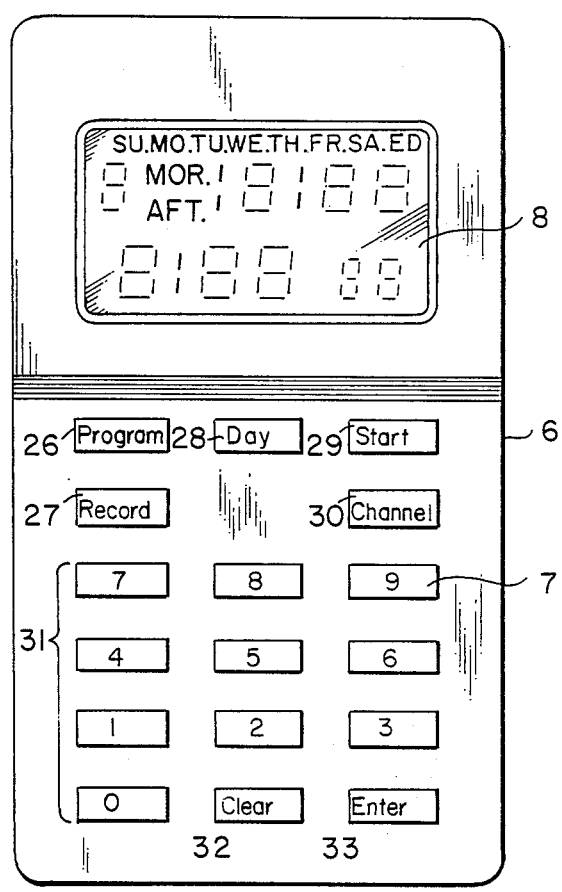
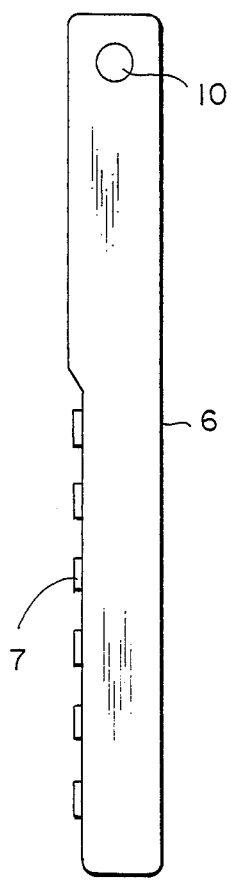
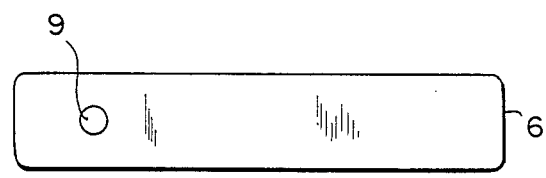
FIG. 2(C)

FIG. 4(A)
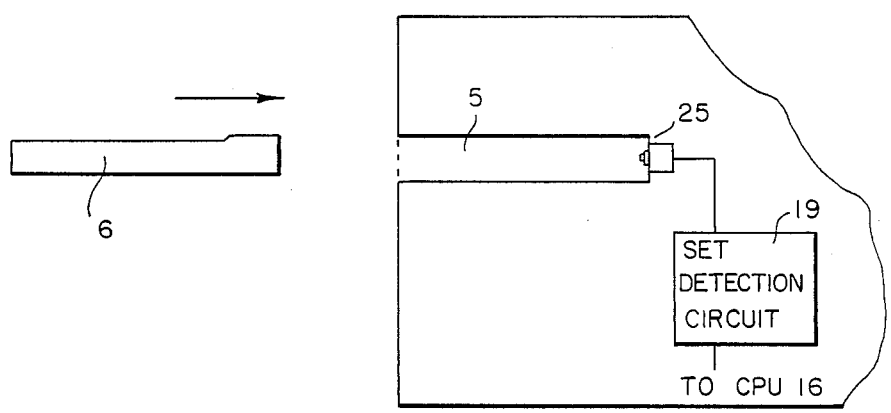
FIG. 4(B)
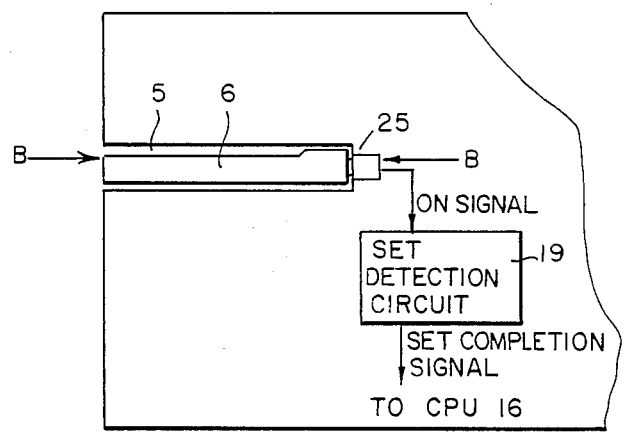
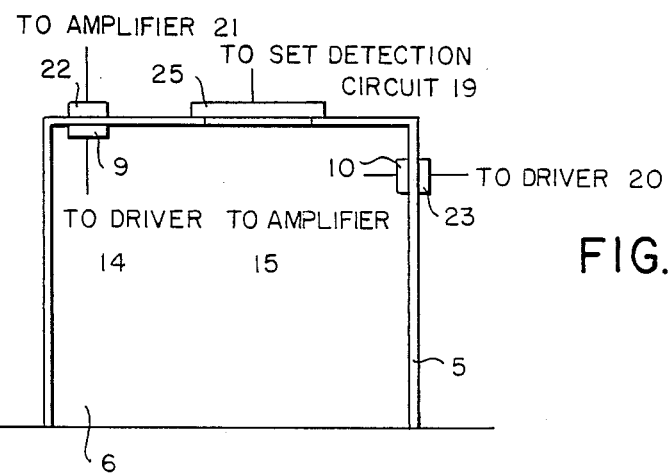
FIG. 4(C)

REMOVABLE INFORMATION INPUTTING DEVICE FOR AN ELECTRONIC RECORDING APPARATUS

BACKGROUND OF THE INVENTION

The present invention relates to an information inputting device and, more particularly, to a removable information inputting device for an electronic apparatus such as a video tape recorder, a video disc, a cassette tape recorder, etc. which can store information of a program to be recorded on a recording medium for the electronic apparatus.

In a vide tape recorder, for example, a circuit for inputting and storing information of a program to be recorded on the magnetic tape is fixed to the main body of the video tape recorder, so that the inputting circuit cannot removed from the main body of the video tape recorder to operate the information inputting circuit.

When the video tape recorder is operated to record a desired program on a television, a recording start time, a recording period of time, a television channel number, and the like are inputted and stored in the video tape recorder by using a key input device provided on the video tape recorder. Therefore, the input of the information of the program to be recorded may be delayed. The data input cannot be carried out at a place far from the video tape recorder. Since the key input device provided on the main body of the video tape recorder is used, the order of the key input is slow.

Therefore, it is desired that a novel information inputting device be provided to store information of a program to be recorded when the information inputting device is removed from the main body of the electronic apparatus and to transmit the stored information to a main body of the electronic apparatus to be controlled by the stored information.

SUMMARY OF THE INVENTION

Accordingly, it is an object of the present invention to provide a removable information inputting device which is detachably provided with the main body of an electronic apparatus such as a video tape recorder. The information inputting device enables easy input and storage of information of a program to be recorded.

It is another object of the present invention to provide a removable information inputting device for an electronic apparatus which includes a memory for storing information of a program to be recorded and an optical information transmission circuit for optically transmitting the information stored in the memory to a main circuit of the main body of the electronic apparatus.

It is still another object of the present invention to provide a removable information inputting device for an electronic apparatus which can store information of a program to be recorded on a recording medium and can transmit the stored information to a main circuit of an electronic apparatus when the information inputting device is set at a predetermined condition.

It is a further object of the present invention to provide an electronic apparatus comprising a recording and reproducing device for recording or reproducing a program or a recorded program and a detachable information inputting device for inputting and storing information of the program to be recorded or the recorded program, in which the stored information in the detachable information inputting device is transmitted to a main circuit of the recording and reproducing device when the detachable information inputting device is set in a predetermined condition so that the recording and reproducing device is operated in response to the transmitted information.

Other objects and further scope of applicability of the present invention will become apparent from the detailed description given hereinafter. It should be understood, however, that the detailed description of and specific examples, while indicating preferred embodiments of the invention, are given by way of illustration only, since various changes and modifications within the spirit and scope of the invention will become apparent to those skilled in the art from this detailed desccription.

To achieve the above objects, according to an embodiment of the present invention, a removable information inputting device for an electronic apparatus includes a device for inputting information of a program to be recorded, a memory responsive to the inputting device for storing the input information, and a device for optically transmitting the stored information to an external apparatus having a circuit for controlling the transmitted information.

BRIEF DESCRIPTION OF THE DRAWINGS

The present invention will be better understood from the detailed description given hereinbelow and the accompanying drawings which are given by way of illustration only, and thus are not limitative of the present invention and wherein:

FIG. 2(4) shows an enlarged plan view of a display of a removable information inputting device of FIG. 2(1);

FIGS. 4(1) and 4(2) show views explaining a storing operation of the removable information inputting device to the memory portion of the video tape recorder;

FIG. 4(3) shows a sectional view of a removable information inputting device of FIG. 4(2) for explaining the set completion of the removable information inputting device;

FIG. 5(2) shows an enlarged plan view of a display of a removable information inputting device of FIG. 5(1).

DETAILED DESCRIPTION OF THE EMBODIMENTS

Figure 1:
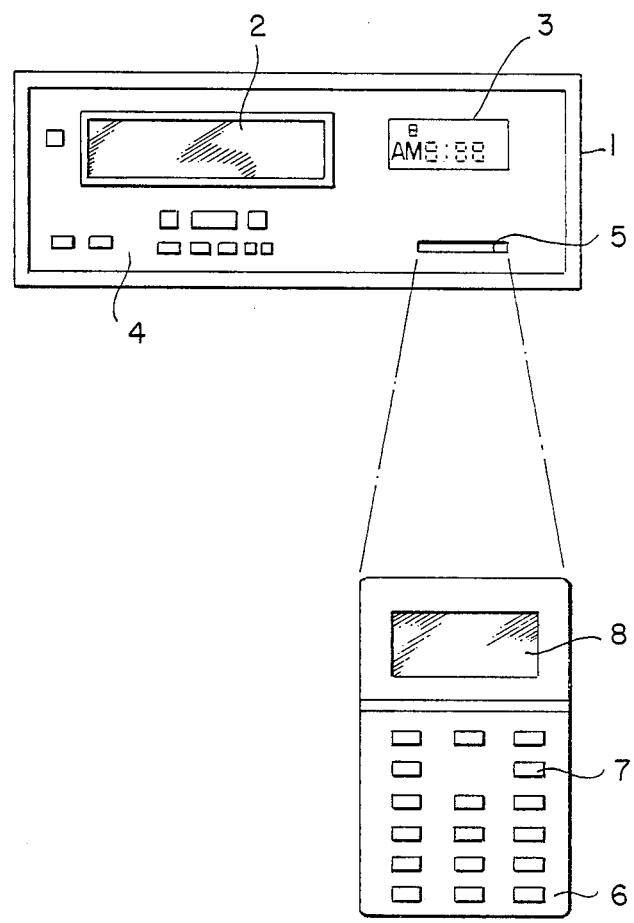
FIG. 1 shows a view of an electronic apparatus including a video tape recorder and a removable information inputting device according to an embodiment of the present invention.

A preferred embodiment of a removable information inputting device of the present invention will be described with reference to FIGS. 1 through 5. An electronic apparatus system as shown in FIG. 1 includes a video tape recorder 1 and a removable information inputting device 6 which can be stored within an area 5 of the video tape recorder 1. The electronic apparatus system should not be limited to the video tape recorder. For example, a video disc, a cassette tape recorder or a television may be used.

The video tape recorder 1 of the present invention mainly functions as a video tape recorder. As shown in FIG. 1, the video tape recorder 1 includes a tape inserting portion 2 for inserting and storing a video cassette tape by a front loading mechanism, a display portion 3 such as a liquid crystal display and an EL (Electroluminecent) display, for displaying the present time, a tape counter number, information of a program to be recorded, or the like, a control area 4 such as a key inputting panel for inputting control data which controls the video tape recorder 1, and the area 5 for receiving and storing the removable information inputting device 6 at a predetermined position.

Figure 3:
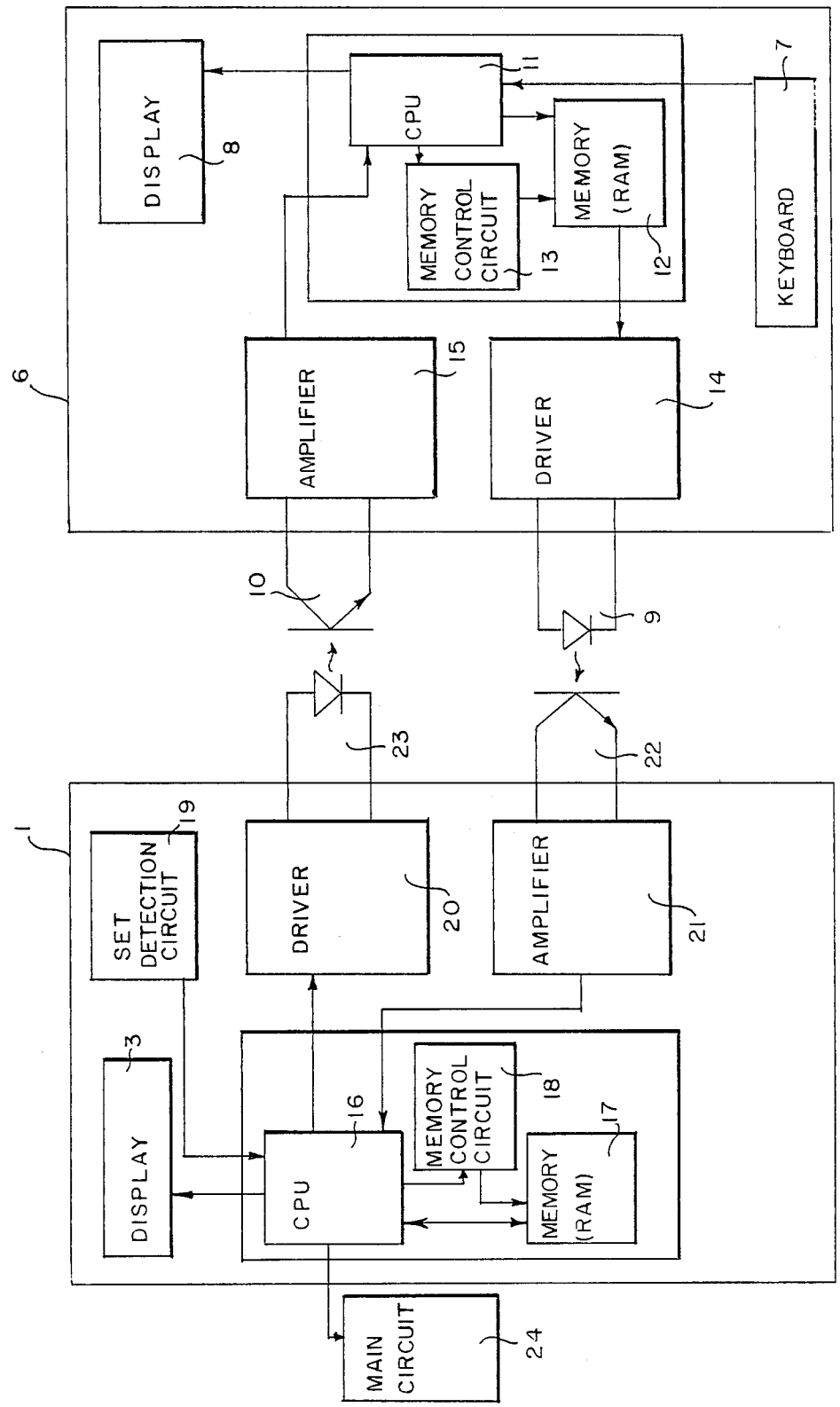
FIG. 3 shows a circuit diagram of a removable information inputting device and a related portion of a video tape recorder according to an embodiment of the present invention.

The video tape recorder 1, as shown in FIG. 3, further includes a memory (RAM) 17 for storing program information to be recorded, an optical transmission circuit including a phototransistor 22, a light emitting diode 23, a driver circuit 20 for controlling the light emitting diode 23 responsive to a central processing unit (CPU) 16, and an amplifier circuit 21 responsive to the phototransistor 22, a memory control circuit 18 for controlling the input and the output of the RAM 17 responsive to the CPU 16, a set detection circuit 19 for detecting the set completion of the removable information inputting device 6, and a main circuit 24 for operating the recording mechanism or the reproducing mechanism of the video tape recorder 1. The main circuit 24 is controlled to operate the recording mechanism or a reproducing mechanism by the data stored in the RAM 17. The driver circuit 20 converts the set detection signal in digital to a voltage signal. The light emitting diode 23 converts the voltage signal to the turn on/off signal of light. The phototransistor 22 converts the turn on/off signal of light to current signals. The amplifier circuit 21 converts the current signals to the digital information.

Figure 2D:
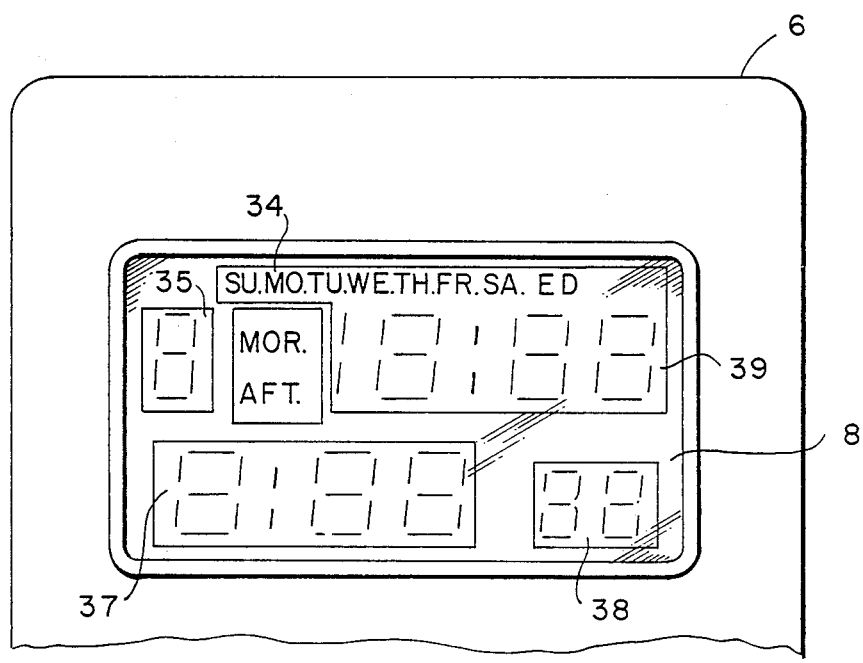
FIGS. 2(1), 2(2), and 2(3) show enlarged plan, enlarged side, and enlarged upper views, respectively, of a removable information inputting device according to an embodiment of the present invention.

The removable information inputting device 6 as shown in FIGS. 1, 2(1), 2(2), 2(3), and 3, include key inputting means 7 for inputting information of a program to be recorded a display portion 8 such as the liquid crystal display and the EL display for displaying the information input by the key inputting means 7, a memory (RAM) 12 for storing the input information of the program to be recorded by the key inputting means 7, an optical transmission circuit for transmitting the data relating to the inputted information, the transmission circuit comprising a light emitting diode 9, a phototransistor 10 for receiving a light from the light emitting diode 23, an amplifier circuit 15 responsive to the phototransistor 10, and a driver circuit 14 for controlling the light emitting diode 9 responsive to a central processing unit (CPU) 11, a memory control circuit 13 for controlling the input and the output of the RAM 12 which is also responsive to the CPU 11. The phototransistor 10 converts the on/off signal of the LED 23 to current signals. The amplifier circuit 15 converts the current signals to digital data. The driver circuit 14 converts the digital information from the RAM 12 to voltage signals. The light emitting diode 9 converts the voltage signals to turn on/off the light signal.

The key inputting means 7 includes numeral keys (0 through 9) 31, a television channel key 30, a program key 26, a recording key 27, a "day" key 28, a recording start key 29, a clear key 32, an enter key 33, and the like. The removable information inputting device 6 is provided to store information corresponding to a plurality of programs to be recorded. For exmaple, the information of five programs to be recorded can be stored at the same time. The inputting operation of the information to be recorded will be described. First, the program key 26 is pressed so that the number of the recorded program is selected from the program numbers 1 through 5 in turn. The program number is displayed on an area 35 of the display 8. After the channel key 30 is pressed, the channel number is inputted by pressing one or two of the numeral keys 31, and then the enter key 33 is pressed to store the channel number in the memory. The channel number is displayed on an area 38 of the display 8. When the "day" key 28 is pressed so as to select one of Sunday (SU), Monday (M), Tuesday (TU), Wednesday (WE), Thursday (TH), Friday (FR), Saturday (SA), and Every day (ED). After the one of the "days" keys is selected, the enter key 33 is pressed. The day data is displayed on an area 34 of the display 8. Next, "morning" (MOR) or "afternoon" (AFT) is selected by the depression of the day key 28, and then the enter key 33 is depressed. This data is displayed on an area 36 of the display 8. After the start key 29 is pressed, the program start time is inputted by the numeral keys 31, and then the enter key 33 is pressed. The recording start time is displayed on an area 39 of the display 8. After the record key 27 is pressed, the recording period of time is inputted by the numeral key 31, and then the enter key 33 is pressed. The recording period of time is displayed on an area 37 of the display 8. If inputting of the information is missed, the clear key 32 is pressed so as to clear the memory. The data inputted by the key inputting means 7 is displayed on the predetermined area of the display 8.

Figure 5A:
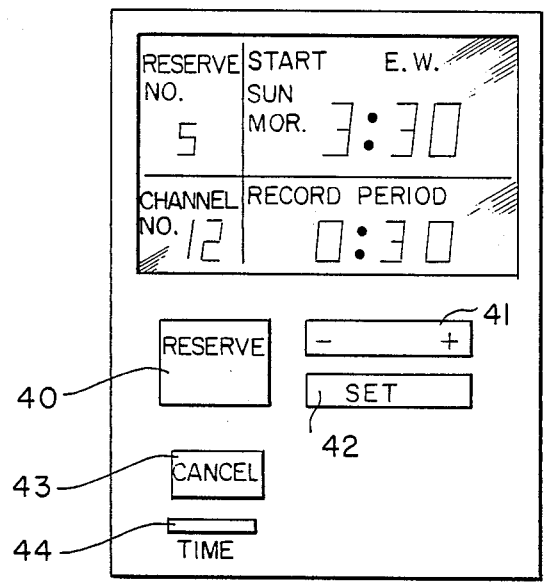
FIG. 5(1) shows a plan view of a removable information inputting device according to another embodiment of the present invention.
Figure 5B:
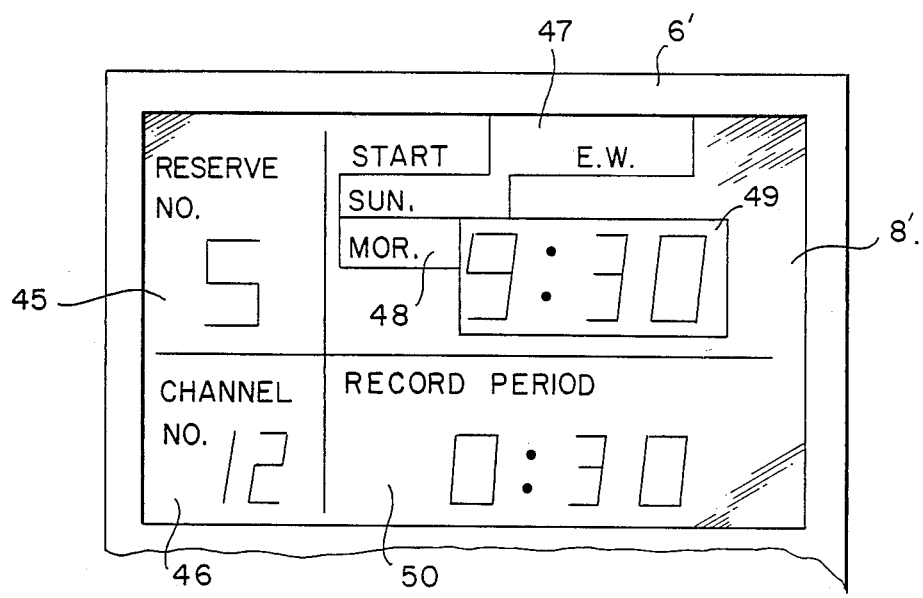

FIG. 5(1) shows a plan view of a removable information inputting device according to another embodiment of the present invention. The key inputting means 7' of the removable information inputting device 6' includes a reserve key 40, an up/down key 41, a set key 42, a cancel key 43, a time set key 44, and the like. The reserve key 40 is operated to select a program number from 1 through 5. After the reserve number is selected and is displayed on an area 45 of the display 8', the channel number display portion 46 on the display 8' is turned on/off. In this condition, the channel number inputting is carried out. The up/down key 41 is operated to select the channel number. The "+" portion of the up/down key 41 is pressed, so that the number on the display is counted up. When the "−" portion on the up/down key 41 is pressed, the number on the display is counted down. After the channel number is selected, the set key 42 is pressed to store the channel number. After the channel selection, the record start information such as a recording day is selected. For example, one of Sunday, Monday, Tuesday, Wednesday, Thursday, Friday, Saturday, Every day, and Every week is selected by the up/down key 41 and after the set key 41 is pressed. By pressing the up/down key, the selections are succesively displayed on an area 47 of the display 8'. The "Morning" or "Afternoon" is selected by the up/down key 41 and then the set key 42 is pressed. This information is displayed on an area 48 of the display 8'. After the day information is selected, the start time is set by the up/down key 41. After the start time is selected and is displayed on an area 49 of the display 8', the set key 42 is pressed. Next, the recording period of time is selected by pressing the up/down key 41, and then the set key 42 is pressed. The recording period of time is displayed on an area 50 of the display 8'. If inputting of the data is missed, the cancel key 43 is pressed to remove the input data. When the reserve number is turned on/off, the cancel key 43 is depressed to remove the information of the program to be recorded corresponding to the reserve number. The removable information inputting device 6' may further include a timepiece so that the present time counter by the timepiece is displayed on the display 8'. The time key 44 is operated to control the time of the timepiece. The time key 44 may operate to control the record start time, or the length of recording time.

The removable information inputting device 6 is usually stored in area 5 of the video tape recorder 1 as shown in FIG. 4(2), and is removed from the video tape recorder 1 when the removable information inputting device 6 is operated to store the information of the program to be recorded. The removable information inputting device 6 is basically operated as described below. After the information of the program to be recorded is stored in the removable information inputting device 6, the removable information inputting device 6 is inserted into the storing area 5 as shown in FIG. 4(1) and 4(2). When the removable information inputting device 6 is set to a predetermined position a switch 25 provided in the storing area 5 is switched on. The ON signal is applied to the set detection circuit 19. A set completion signal from the set detection circuit 19 is applied to the main body of the video tape recorder 1. The main body of the recorder 1 outputs a set completion signal to the removable information inputting device 6. The removable information inputting device 6 receiving the set completion signal operated to transmit the information of the program to be recorded from the memory of the removable information inputting device 6 to the main body of the recorder 1. The transmitted information is stored in the memory of the video tape recorder 1. Depending on the time counter by a timepiece incorporated within the main body of the video tape recorder 1, the recording mechanism or a reproducing mechanism is operated by the stored information applied from the removable information inputting device 6.

I. Detection of the storing of the removable in information inputting device:

After the information of the program to be recorded is stored in the removable information inputting device 6, the removable information inputting device 6 is horizontally inserted into the storing area 5 of the video tape recorder 1 as shown in FIG. 4(1). When the removable information inputting device 6 is further inserted, the switch 25 provided in the storing area 5 is pressed by the removable information inputting device 6 so that the switch 25 is switched on. The ON signal of the switch 25 is applied to the set detection circuit 19. The set detection circuit 19 outputs a set detection signal to the CPU 16. The driver cricuit 20 is operated by the control signal of the CPU 16 so as to emit the light emitting diode 23. The light from the light emitting diode 23 is received by the phototransistor 10. The data received by the phototransistor 10 is amplified and controlled by the amplifier circuit 15, and in other words, converts the current signals to the digital data. The output of the amplifier circuit 15 is applied to the CPU 11. As described above, the set completion of the removable information inputting device 6 into the storing area 5 of the video tape recorder 1 is judged and informs the removable information inputting device 6.

When the removable information inputting device 6 is inserted into the storing area 5 of the video tape recorder 1 and the set completion of the removable information inputting device 6 is detected the light emitting diode 23 provided on the main body of the video tape recorder 1 emits light. The light from the light emitting diode 23 is received by the set completion detecting phototransistor 10. The stored information in the removable information inputting device 6 is optically transmitted to the main body of the video tape recorder 1 through the light emitting diode 9 and the phototransistor 22. The light emitting diodes 9 and 23 and the phototransistors 10 and 22 are provided as shown in FIG. 4(3). The portions having the light emitting diode 9 and the phototransistor 10 are at right angles to each other. The light emitting diode 9 for transmitting the information stored in the removable information inputting device 6 is provided on the inserting top plate of the removable information inputting device 6, the phototransistor 10 for detecting the set completion of the removable information inputting device 6 is provided on the side plate of the device 6. The transmission of the information of the program to be recorded is carried out via the turn/off signals of the light emitting diode 9. The detection of the set completion of the removable information inputting device 6 is carried out via the on/off signals of the light emitting diode 23. The light emitting direction of the light emitting diode 9 and the light receiving direction of the phototransistor 10 are provided at the right angles to prevent the light of the light emitting diode 9 from being applied into the phototransistor 10. If the light of the light emitting diode 9 is applied to the phototransistor 10, the phototransistor 10 may malfunction.

II. The operation of the removable information inputting device:

First, the removable information inputting device 6 is removed from the storing area 5 of the video tape recorder 1. Information of a program to be recorded is inputted by the key inputting means 7. In this case, since the removable information inputting device 6 is removed from the video tape recorder 1, the information of the program to be recorded can be exactly inputted with reference to a program sheet at a place which is apart from the video tape recorder 1 and near the removable information inputting device 6. The information of the program to be recorded includes a recording start time, a recording period of time, a channel number on a television, a timer program number, and the like.

The information inputted by the key inputting means 7 is applied to the CPU 11 and stored in the RAM 12. At the same time, the inputted information is displayed on the display 8.

After the information of the program to be recorded is inputted into the removable information inputting device 6, the removable information inputting device 6 is again stored into the storing area 5 of the video tape recorder 1. For example, the information inputting device 6 is horizontally inserted into the storing area 5 as shown in FIGS. 4(1) and 4(2). The inserting head of the removable information inputting device 6 reaches a switch 25 and is further inserted into the area 5 to switch on the switch 25. When the switch 25 is switched on, storing of the removable information inputting device 6 is completed. The set detection circuit 19 receives the ON signal from the switch 25 and applies the set detection signal to the CPU 16. A control signal from the CPU 16, responsive to the set detection signal is applied to the driver circuit 20. The light emitting diode 23 is emitted responsive to the driver circuit 20. The light emitting diode 23 is provided for informing or indicating the set completion of the removable information inputting device 6 to the removable information inputting device 6.

The light from the light emitting diode 23 as the set completion signal is received by the phototransistor 10. The signals received by the phototransistor 9 is amplified and controlled by the amplifier circuit 15 and is applied to the CPU 11. After the CPU 11 receives the signal from the amplifier circuit 15, the CPU 11 outputs the control signal to operate the memory control circuit 13. The memory control circuit 13 outputs an output signal to the memory 12. As soon as the RAM 12 receives the output signal, the RAM 12 outputs the stored information of the program to be recorded. The information from the memory 12 is applied to the driver circuit 14. The driver circuit 14 converts the information in the digital signal to voltage signals and applies the voltage signals to the light emitting diode 9. The light emitting diode 9 receiving the voltage signals is turned on/off, to emit and transmits the information to the phototransistor 22 of the video tape recorder 1.

The phototransistor 22 receives the information from the light emitting diode 9 and is applies it to the amplifier circuit 21. The amplifier circuit 21 amplifies the received information and converts the current signal to the information in the digital signal and applies it to the CPU 16. The CPU 16 is operated to store the information in the memory 17.

The information of the program to be stored in the RAM 17 is compared with the present time of timepiece provided in the video tape recorder 1 responsive to the CPU 16. When the recording start time in the stored information of the program to be stored is equal to the present time counted by the timepiece, the information in the RAM 17 relating to the program to be stored is read out and is applied to the control circuit of the recording mechanism to start the recording of a desired program.

The data of the set completion of the removable information inputting device 6 is transmitted between the light emitting diode 23 and the phototransistor 10 via the on/off signal of the light emitting diode 23. The information of the program to be recorded is transmitted between the light emitting diode 9 and the phototransistor 22 via the turn on/off signals of the light emitting diode 9.

As described above, the removable information inputting device of the present invention stores the information of the program to be recorded after the removable information inputting device is removed from the main body of the electronic apparatus such as the video tape recorder. The removable information inputting device is set and stored at the predetermined position of the electronic apparatus after the information of the program to be recorded is memorized in the removable information inputting device, and then the stored information in the removable information inputting device is optically transmitted to the main body of the electronic apparatus. As the manual input of the information of the program to be recorded can be conducted near to the user and apart from the video tape recorder, the manual input of the program information can easily be stored in the removable information inputting device with reference to a program sheet of a newspaper at a suitable place apart from the main body of the electronic apparatus.

The removable information inputting device of the present invention may used not only in a fixed type video tape recorder but a portable type video tape recorder as well.

During the period of not transmittting the program information, the informatio inputting device as described above may be left within the main body of the video tape recorder, or outside it.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An electronic recording and reproducing apparatus comprising:
   a removable information inputting device for providing programming information to said apparatus, said removable information inputting device including
   key input means for inputting program recording information into the removable device,
   display means for displaying the input program recording information,
   memory means for storing the input program recording information,
   optical transmission means for optically transmitting data relating to the input program information in said memory means to said electronic recording and reproducing apparatus, said optical transmission means including a light emitting diodie and a phototransistor, and
   memory control means for controlling input and output of program recording information to said memory means;
   means for loading a recording and reproducing medium into said apparatus;
   a display portion for displaying current program recording or reproducing information;
   key input means for directly controlling operations of said electronic apparatus;
   means for receiving said removable information inputting device internally of said electronic apparatus;
   memory means for storing program information optically transmitted from said removable information inputting device;
   optical transmission means for communicating with said removable information inputting device, said optical transmission means including a phototransistor and a light emitting diode;
   memory control means for controlling input and output of program recording and reproducing information received from said removable information inputting device;
   means for detecting complete insertion of said removable information inputting device internally of said electronic recording and reproducing apparatus; and
   means for operating said recording and reproducing apparatus according to information stored in said memory means;
   wherein upon complete insertion of said removable information inputting device into said electronic recording and reproducing apparatus, said removable device optically transmits recording information to said memory means of said electronic apparatus through the light emitting diode of said removable device and phototransistor of said electronic apparatus such that the electronic apparatus operates by the stored information received from said removable information inputting device.

2. The electronic recording and reproducing apparatus according to claim 1, wherein said removable information inputting device further includes an amplifier circuit responsive to said phototransistor, a control processing unit, and a driver circuit for controlling the light emitting diode in response to instructions from the central processing unit.

3. The electronic recording and reproducing apparatus according to claim 1, wherein said apparatus further includes a central processing unit, a driver circuit for controlling the light emitting diode in response to instructions from said central processing unit, and an amplifier circuit responsive to said photoransistor.

4. The electronic recording and reproducing apparatus according to claim 1, wherein said light emitting diode and said phototransistor of said removable information inputting device are positioned at right angles to each other and opposed to said phototransistor and said light emitting device, respectively, in order to prevent light of the removable information inputting device light emitting diode from being applied to the phototransistor of the removable information inputting device and causing a malfunction.

* * * * *